US005496760A

United States Patent [19]

Matsuzaki

[11] Patent Number: 5,496,760

[45] Date of Patent: Mar. 5, 1996

[54] METHOD FOR MANUFACTURING DIELECTRICS DIVIDING WAFER WITH ISOLATED REGIONS

[75] Inventor: Kazuo Matsuzaki, Matsumoto, Japan

[73] Assignee: Fuji Electric Company, Ltd., Japan

[21] Appl. No.: 291,991

[22] Filed: Aug. 18, 1994

Related U.S. Application Data

[62] Division of Ser. No. 186,890, Jan. 27, 1994, Pat. No. 5,381,033, which is a continuation of Ser. No. 877,723, May 4, 1992, abandoned.

[30] Foreign Application Priority Data

May 9, 1991 [JP] Japan .................................... 3-102897

[51] Int. Cl.$^6$ .................................................. H01L 21/301

[52] U.S. Cl. .................................... 437/62; 148/DIG. 12; 148/DIG. 85; 148/DIG. 86

[58] Field of Search ............ 437/62, 227; 148/DIG. 12, 148/DIG. 85, DIG. 86; 257/501, 502

[56] References Cited

U.S. PATENT DOCUMENTS

| | | | |
|---|---|---|---|
| 3,343,255 | 9/1967 | Donovan | 29/577 |
| 3,534,234 | 10/1970 | Clevenger | 317/235 |
| 3,648,125 | 3/1972 | Peltzer | 317/235 |
| 3,966,577 | 6/1976 | Hochberg | 204/192 |
| 3,970,486 | 7/1976 | Kooi | 148/187 |
| 3,979,765 | 9/1976 | Brand | 357/23 |
| 4,837,186 | 6/1989 | Ohoto et al. | 437/228 |
| 4,862,240 | 8/1989 | Watanabe et al. | 357/42 |
| 4,948,748 | 8/1990 | Kitahara et al. | 437/62 |
| 5,072,287 | 12/1991 | Nakagawa et al. | 257/502 |

FOREIGN PATENT DOCUMENTS

| | | | |
|---|---|---|---|
| 1-253265 | 10/1989 | Japan | 257/502 |

OTHER PUBLICATIONS

IEEE 1987 Custom Integrated Circuits Conference, "Dielectrically Isolated Intelligent Power Switch", Yu Ohata and Takao Izumita, pp. 443–446.

*Primary Examiner*—Olik Chaudhuri
*Assistant Examiner*—Thomas G. Bilodeau
*Attorney, Agent, or Firm*—Parkhurst, Wendel & Rossi

[57] ABSTRACT

A dielectrics dividing wafer, and a method of manufacturing the wafer, is disclosed in which embedded dielectric films are provided in the interior of the wafer in a predetermined pattern extending laterally parallel to a face surface of the wafer, and partition dielectric films, in the form of vertical walls extending from the face surface and the rear surface of the wafer, to the embedded dielectric films, are provided to define semiconductor areas extending continuously from the face surface of the wafer to the rear surface of the wafer. The semiconductor areas can be used for vertical circuit elements. The partition dielectric films in conjunction with the embedded dielectric films and the face surface of the wafer also define additional planar semiconductor areas that can be used for planar structure circuit elements.

1 Claim, 3 Drawing Sheets

22
22
22a
21

22
22
20
23
21

24
24
24
20a
24a
22
22
24
20b
24a 25
25
22
22
25
25

26
26
26
26

20a
25
25
28
23
22
26
20
25
25
26
20b
27
27
21

METHOD FOR MANUFACTURING DIELECTRICS DIVIDING WAFER WITH ISOLATED REGIONS

This is a division of application Ser. No. Divisional of Ser. No. 08/186,890 filed Jan. 27, 1994, now U.S. Pat. No. 5,381,033 which in turn is a continuation of Ser. No. 07/877,723 filed May 4, 1992, now abandoned.

FIELD OF THE INVENTION

The present invention relates to a dielectrics dividing wafer made from semiconductor materials used for integrated circuit devices and the like, wherein the faces of the wafer are divided into many semiconductor areas electrically insulated from each other by the dielectric films, and a method to manufacturing the wafer.

BACKGROUND OF THE INVENTION

The interior of the dielectrics dividing wafer is divided potentially or electrically into many semiconductor areas in order to avoid operational interference among semiconductor elements and circuit elements formed therein. Moreover, the devices are usually made with these circuit elements allotted to these semiconductor areas, regardless of whether they are of the bipolar type, MOS type or BiMOS type. A generally known means to make such a division is the bonding-dividing method. This method, however, does not completely prevent operational interference among the circuit elements because the semiconductor areas are separated from each other only potentially by a "pn" junction in a reverse condition. Moreover, unexpected trouble may occur during operations because of the effects of parasitic transistors. The circuit elements must therefore be separated from each other by more than a certain minimum amount.

The dielectrics dividing method electrically insulates the semiconductor areas from each other, providing insulating isolation rather than potential isolation, thereby allowing very little operational interference among the circuit elements, an provides the added benefit of making it possible to arrange the circuit elements more closely, which is necessary to ensure greater circuit integration. The dielectrics dividing wafer can therefore be used in high-performance circuits, as well as in high-frequency circuits, although it is more expensive than the bonded-divided wafer. The present invention is related to the production of a wafer by the dielectrics dividing method.

Dielectrics dividing wafer has been known for a long time as a wafer constructed with many semiconductors, consisting of monocrystalline silicon carried on a wafer substrate made of polycrystalline silicon via silicon oxide dielectric films or silicon nitride films or composite films made up of both compounds. A method to manufacture this type of wafer with dielectrics dividing construction in which the semiconductor areas are carried by the polycrystalline silicon may include, as disclosed in U.S. Pat. Nos. 3,534,234, 3,648,125 and 3,970,486, processes to trench V-shaped grooves in a frame-like pattern over one face of a monocrystalline silicon wafer, cover the face including the grooves with dielectric films, fill in the grooves with polycrystalline silicon deposited by the CVD process or some other means to make deposits with the desired thickness, and divide the monocrystalline silicon wafer into island-like semiconductor areas carried by the polycrystalline silicon via the dielectric films, by grinding the monocrystalline silicon wafer from the other side until the polycrystalline silicon in the grooves are exposed. A method to make the groove rectangular is disclosed in U.S. Pat. No. 3,966,577, and a method to fill these rectangular grooves with an insulating material is disclosed in U.S. Pat. No. 8,979,765.

The recent development of technology for bonding monocrystalline silicon substrates has achieved the stage of practical application, making it possible to produce dielectrics dividing wafers by combining technology for cutting trenches with the reactive-ion etching process. The bonding of substrates has been known for a long time having been disclosed in the Japanese laid-open patent application No. 39-17869, though it was not successful in practical application despite the fact that it drew much interest. However, the advancement of technologies to grind and clean surfaces to be bonded has made practical application possible.

With this method of dividing dielectrics of bonding substrates, two silicon substrates are bonded together with a silicon oxide film interposed between them, one of the substrates is ground to the desired thickness, small trenches are cut from the surface thereof in a frame pattern deeply enough to reach the silicon oxide film on the bonded surface, the surface including the trenches is covered with a dielectric film, and the trenches are filled with polycrystalline silicon, then the polycrystalline silicon and the dielectric film on the one side of the substrate is removed. Thus, the substrate is divided into several semiconductor areas in which one of the substrates is insulated by the silicon oxide film and the substrates are separated from each other by the dielectric film.

The dielectrics dividing wafer using polycrystalline silicon as its substrate entered the practical application phase quite some time ago, as did the one which applied a substrate bonding construction, and both are used in integrated circuit devices requiring small power. However, recent increasing applications to drive loads directly with integrated circuit devices have found the conventional dielectrics dividing wafers described above to be unsuitable when circuit elements such as vertical-type field effect transistors that can handle more power are incorporated in such devices.

The vertical circuit elements that will handle large power require disposing electrode films for internal wiring or external connection both on the surface of a wafer and on the rear side thereof. However, in conventional dielectrics dividing wafer constructions, a dielectric film exists between the semiconductor areas where the circuit elements are to be built in, and polysilicon or silicon substrates which are the base substance of the wafer. Thus, terminals cannot be led out for the vertical circuit elements from the rear of the wafer.

As a result, in convention processes, the thickness of the semiconductor area is initially increased and an embedded layer with a high concentration of impurity is disposed at the bottom thereof, whereas a connection is made to an electrode film on the surface via the connection layer with a high concentration of impurities. There is a limit, however, to the thickness of the semiconductor area, which makes it difficult to make vertical circuit elements with a sufficient power capacity, and requires additional processes and spaces to create the embedded and connection layers, thus offsetting the advantages of the dielectrics separation.

It is possible to utilize a wafer with the construction proposed by Proceeding IEEE 1987 Custom IC Conference, pp. 443–446, May 1987, since the dielectrics dividing wafer is advantageous for building vertical circuit elements that can solve the above problems. This wafer has a silicon substrate surface initially provided with a silicon oxide film with the desired pattern, upon which silicon can be grown epitaxially, while a continuous epitaxial layer is obtained on the monocrystalline silicon, and polycrystalline silicon forms on the silicon oxide film. For instance, the epitaxial layer is divided into more than two semiconductor areas insulated from the substrate by the silicon oxide film via cutting trenches in the polycrystalline silicon that reach the silicon oxide film and cover the trenches with dielectric film. As a result, vertical circuit elements that can handle large power can be built into each semiconductor area as well as into the silicon substrate that is connected to the semiconductor areas.

Such a construction, however, makes the multiple semiconductor areas linked to the silicon substrate common to them, thus resulting in imperfect dielectric separation, and tending to cause insufficient separation among the vertical circuit elements. In addition, although an integrated circuit device requires vertical circuit elements capable of handling large power, as well as horizontal circuit elements capable of handling small power be incorporated in the wafer surface in an ordinary planar structure, the above construction is very inconvenient for separating the wafer into two types of dielectrics, i.e., one a semiconductor area shallow on the surface and suitable for small circuit elements, and the other a semiconductor area that extends from the surface to the rear side and is suitable for vertical circuit elements.

In order to solve these conventional problems, it is a primary objective of the present invention to divide a wafer dielectrically into a semiconductor area which extends from the surface to the rear side, thereby making it suitable for building vertical circuit elements, and a further secondary objective is to divide a wafer surface dielectrically into a semiconductor area suitable for building circuit elements with a planar structure.

SUMMARY

In the dielectrics dividing wafer according to the present invention, the above objectives are achieved by embedding dielectric films in the wafer's interior in a predetermined pattern extending laterally parallel to the wafer face; disposing partition dielectric films in the form of a vertical wall extending from a face surface and a rear surface of the wafer to the embedded dielectric films; and demarcating semiconductor areas extending from the wafer surface to the rear side thereof, which are surrounded by the partition dielectric films.

It is more advantageous to cut the partition dielectric films explained in the above structure with grooves, in the form of a vertical wall, that reach the embedded dielectric films from either the wafer surface or its rear side (the grooves being provided with dielectric films on either side), both sides of the grooves being filled with polycrystalline silicon.

In order to achieve the above-mentioned secondary objective, it is more advantageous to dispose the partition dielectric films that surround the predetermined scope of the pattern of the embedded dielectric film between the wafer surface and the embedded dielectric film, and to demarcate a semiconductor area that is exposed on only the wafer surface as a result of the disposition of the partition dielectric films.

The above objectives are first achieved by the method for manufacturing a dielectrics dividing wafer, which includes a process to attach the dielectric films on one of the faces of the two substrates making up the semiconductors with a predetermined pattern, a process to bond both substrates together at the faces disposed with the dielectric films which are part of a wafer, a process to cut grooves in the form of a vertical wall from the surface and the rear side of the wafer so that the grooves reach the dielectric films in the bonded face, a process to attach the dielectric films to the sides of the grooves, and a process to fill the dielectric films with polycrystalline silicon, while the semiconductor regions are formed continuously from the surface of the wafer surrounded by the dielectric films attached to the sides of the grooves to the rear surface of the wafer, and are demarcated.

Through this first manufacturing method, the above secondary objective is achieved by means of cutting grooves in the form of a vertical wall from the wafer surface in such a manner as to surround the predetermined area of the pattern on the dielectric films attached to the mutually bonded surface of both substrates; and by demarcating the semiconductor area for circuit elements with a planar construction, in order to surround the area that is exposed on only the wafer surface as a result of disposing the dielectric films on the sides of the grooves.

The above objectives are achieved under the second method for manufacturing a dielectrics dividing wafer, by demarcating the semiconductor regions formed continuously from the surface of the wafer surrounded by the dielectric films attached to the recesses and the sides of the grooves to the rear surface of the wafer, for vertical circuit elements, after applying a process to trench recessed sections in the predetermined pattern from the rear side the wafer consisting of semiconductors, a process to cover these recesses with dielectric films, a process to fill the recesses with polycrystalline silicon, a process to cut grooves in the form of a vertical wall from the surface of the wafer so that these grooves reach the dielectric films at the bottom of the recesses, a process to attach the dielectric films to the sides of the grooves, and a process to fill both sides of the grooves with polycrystalline silicon.

Through this second manufacturing method, the above secondary objective can be achieved by cutting grooves in the form of a vertical wall from the wafer surface in a manner which will surround the predetermined area of the pattern on the dielectric films attached to the bottom of the recesses; and by demarcating the semiconductor area for the circuit elements of a planar construction in order to surround the area that is exposed on only the wafer surface as a result of disposing the dielectric films on the sides of the grooves.

A semiconductor area suitable for building in vertical circuit elements requires that the area be formed continuously from the wafer surface to the rear side thereof, and that it be surrounded by dielectric films so that it can be completely isolated dielectrically. However, it is not possible to realize a dielectric film structured in a simple wall or envelope form. For this reason, the dielectrics dividing wafer according to the present invention has (as described in the preceding paragraph) for its configuration, an embedded dielectric film embedded initially in the wafer interior in a predetermined pattern extending laterally parallel to the wafer surface, and has partition dielectric films which are formed in the form of a vertical wall between the embedded dielectric film and the wafer surface, and between the film and the rear side of the wafer, using the embedded dielectric film as a relay, while the semiconductor area formed continuously from the wafer surface to the rear side thereof for vertical circuit elements is demarcated as an area that is completely surrounded by the partition dielectric films on the surface and rear side of the wafer. Such partition dielectric films may be constructed as dielectric films attached to the sides of the cut grooves, for example, from the wafer surface or the rear side thereof to the embedded dielectric film.

The first method for manufacturing such a dielectrics dividing wafer applies a process to attach the dielectric film on one of the faces of the two substrates making up the semiconductors in the predetermined pattern, and a process to bond both substrates together at the faces disposed with the dielectric films to make a wafer, in which an embedded dielectric film is embedded in a pattern extending laterally parallel to the wafer surface. Under the second manufacturing method, recessed sections are trenched in a predetermined pattern from the rear side of the wafer, and the surface is covered with a dielectric film and filled with polycrystalline silicon, while the dielectric film at the bottom of the recess is utilized as the embedded dielectric film inside the wafer, and the dielectric film on the side of the recess as the partition dielectric film on the rear side of the wafer.

Furthermore, a semiconductor area suitable for building in circuit elements with a planar construction has an embedded dielectric film embedded in a pattern suitable for the semiconductor area, and has partition dielectric films disposed in such a way that they reach the semiconductor area from the wafer surface, in the form of vertical walls that surround the whole pattern of the embedded dielectric film, as a result of which the semiconductor area can be demarcated as a dielectrics dividing area that is exposed only on the wafer surface surrounded by the partition dielectric films.

BRIEF DESCRIPTION OF THE DRAWINGS

With the above as background, reference should now be made to the following detailed description of the preferred embodiments of the invention and the accompanying drawings, wherein:

FIG. 1(*b*) is a plan view of the dielectrics dividing wafer illustrated in FIG. 1(*a*);

FIG. 2(*b*) is a plan view of a dielectrics dividing wafer in accordance with the present invention;

DETAILED DESCRIPTION OF THE PREFERRED EMBODIMENTS

Figure 1A:
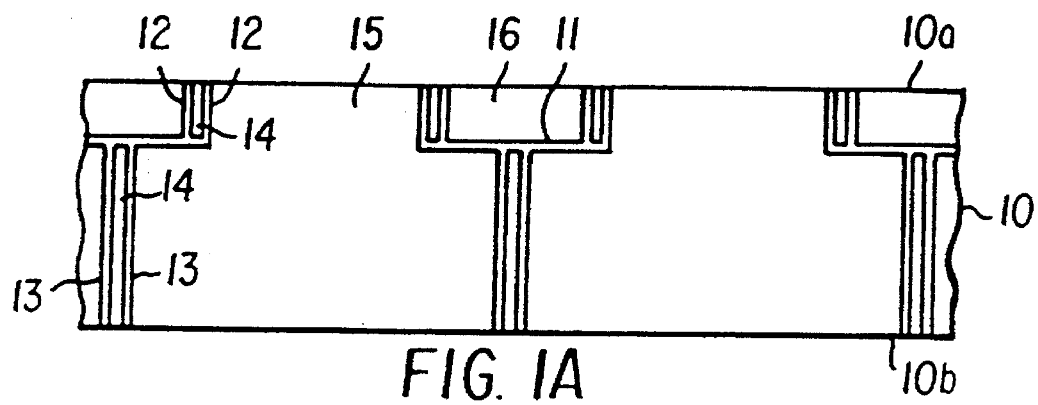
FIG. 1(*a*) is a cross-sectional view of a dielectrics dividing wafer in accordance with the present invention.
Figure 1B:
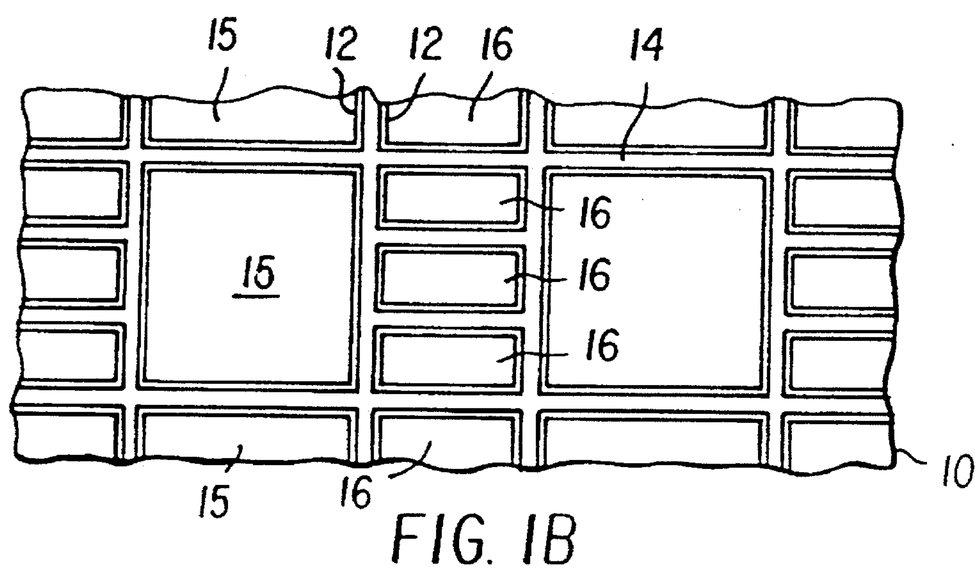

Referring now to FIGS. 1(*a*) and 1(*b*), a wafer 10 is divided dielectrically into a semiconductor area 15 for vertical circuit elements and a semiconductor area 16 for the circuit elements of a planar construction. As shown in FIG. 1(*a*), the semiconductor area 15 is a continuous area formed from the surface **10*a* of a wafer 10 to a rear side 10*b*, while the semiconductor area 16 is an island-like area with an exposed face on only the surface 10*a*, the former including vertical circuit elements with a withstand voltage as high as several hundred volts, and with a capacity as large as several to several dozen amperes, as in vertical field effect transistors and bipolar transistors, while connecting terminals are led out from both the surface 10*a* and the rear side 10*b*, the latter being built in with small circuit elements that operate under voltages of about five volts, as do horizontal field effect transistors and bipolar transistors, from the surface 10*a***, while the connecting terminals are led out from the same side.

In order to dielectrically separate the semiconductor areas 15 and 16, embedded dielectric films 11 with a thickness of 0.5 to 1 μm consisting of, for example, silicon oxide are embedded within the wafer 10 at a depth of, for example, 20 μm from the surface **10*a* in a desired pattern extending laterally parallel to the surface, as shown in FIG. 1**(*a*). Next, partition dielectric films 12 and 13 are disposed in the form of a vertical wall perpendicular to the wafer face in such a manner that the films reach the embedded film 11 from the surface **10*a* and the rear side 10*b* of the wafer 10, as shown in FIG. 1**(*a*). In the illustrated embodiment, these films are silicon oxide films with a thickness of about 1 μm deposited on both sides of the trenches and cut deep enough to reach the embedded dielectric film 11 in the vertical direction. Furthermore, both sides of these trenches are covered with the partition dielectric films 12 and 13 and are filled with polycrystalline silicon 14. In addition, the partition dielectric film 12 on the surface **10*a* of the wafer 10 are disposed, as can be seen in FIG. 1**(*b*), in the form of a vertical wall that surrounds a predetermined range of the pattern in the embedded dielectric films, which is partly shown in FIG. 1(*a*).

Figure 2A:
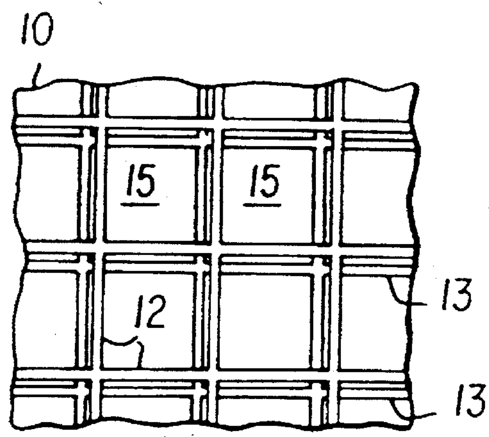
FIG. 2(*a*) is a plan view of a dielectrics dividing wafer in accordance with the present invention.
Figure 2B:
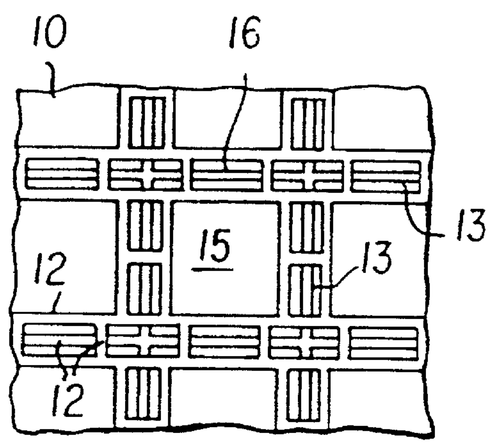
Figure 3A:
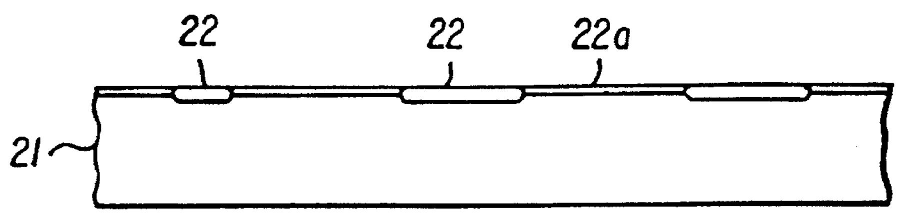
FIGS. 3(*a*)–3(*f*) illustrate a first method for manufacturing a dielectrics dividing wafer in accordance with the present invention.
Figure 3B:
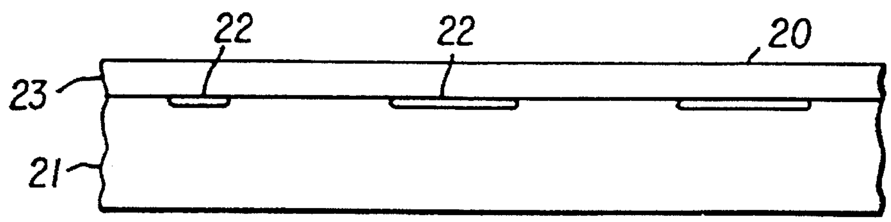
Figure 3C:
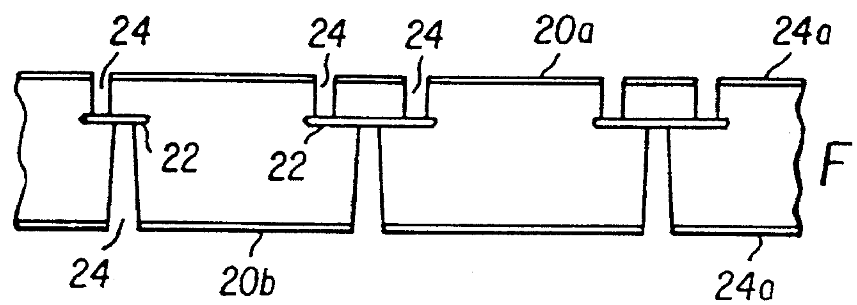
Figure 3D:
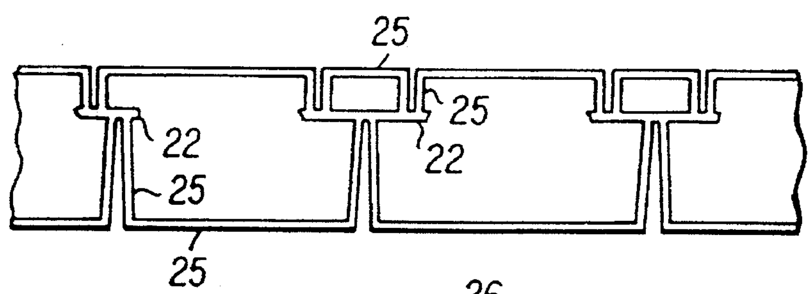
Figure 3E:
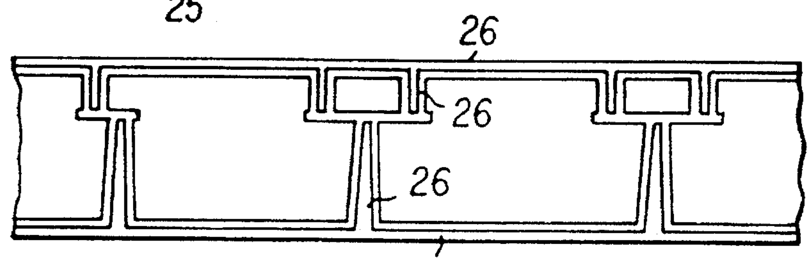
Figure 3F:
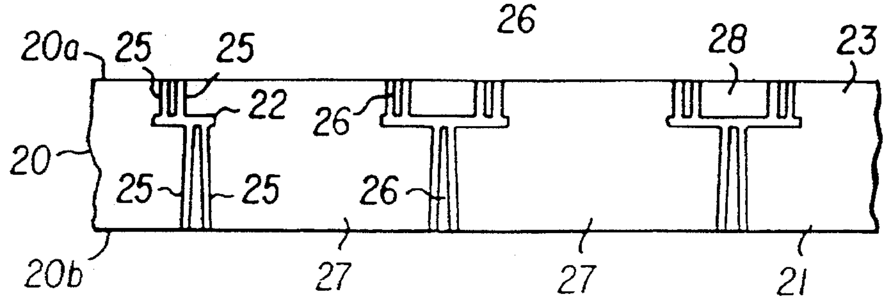
Figure 4A:
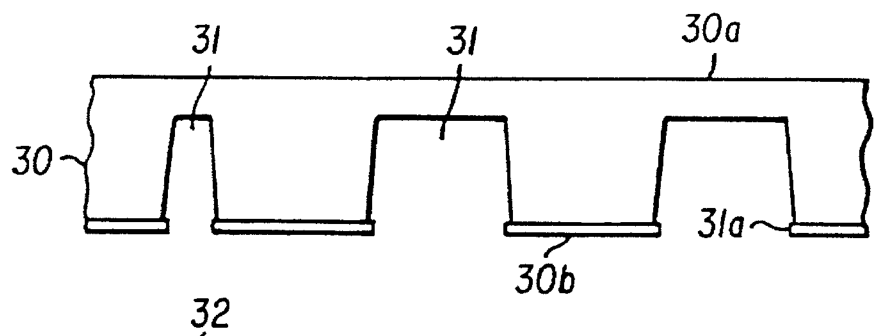
FIGS. 4(*a*)–4(*f*) illustrate a second method for manufacturing a dielectrics dividing wafer in accordance with the present invention.
Figure 4B:
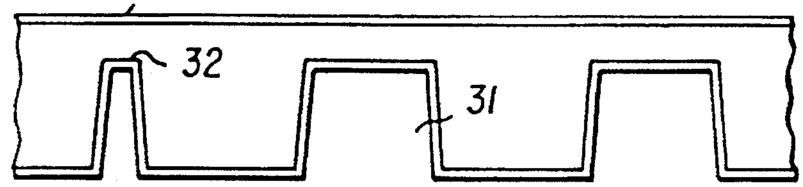
Figure 4C:
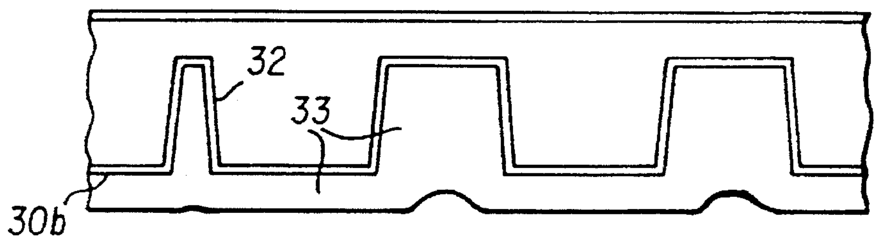
Figure 4D:
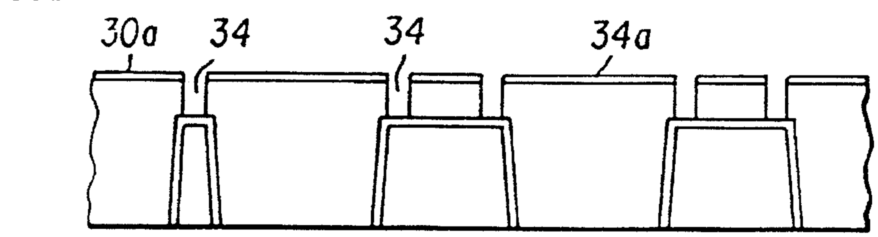
Figure 4E:
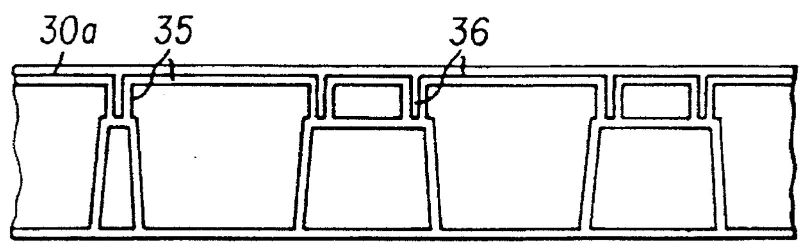
Figure 4F:
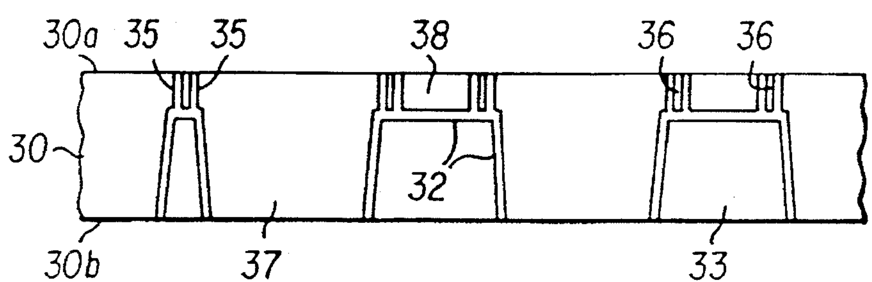

FIGS. 2(*a*) and 2(*b*) show more clearly how the above construction is applied. However, in order to avoid complication, these figures show the partition dielectric films 12 and 18 as single lines without illustrating the polycrystalline silicon 14. In the embodiment shown in FIG. 2(*a*), in which the wafer 10 is bonded and separated only into the semiconductor area 15 for the vertical circuit elements, both lattice-like partition dielectric films 12 and 18 are disposed in a slightly staggered manner as shown in the figure, whereas the embedded dielectric films in FIG. 1 are disposed in a pattern corresponding to the range in which these lattices are superimposed over each other.

In the embodiment shown in FIG. 2(*b*), the semiconductor areas 16 are laid in the form of a lattice, and the partition dielectric film 12 on the surface **10*a* of the wafer 10 is disposed in the form of a vertical wall that surrounds each semiconductor area 16. Therefore, the embedded dielectric film 11 in this case is disposed in a pattern of thick lattices including the semiconductor area 16 and the partition dielectric film 12, and the partition dielectric film 18 on the rear side 10*b*** is disposed in a vertical wall pattern that forms thin lattices passing through the centers of the thick lattices.

The illustrated embodiments clearly indicate that the semiconductor area 15 for vertical circuit elements in the dielectrics dividing wafer according to the present invention are demarcated as the semiconductor areas formed continuously from the surface **10*a* to the rear side 10*b* of the wafer 10, which has a circumference that is surrounded by the partition dielectric films 12 and 13. On the other hand, the semiconductor areas 16 for circuit elements of a planar construction have their bottom face insulated from the semiconductor areas 15 with the embedded dielectric films 11, and are demarcated as semiconductor areas with an exposed face on only the surface 10*a* of the wafer 10, surrounded by the partition dielectric films 12. In a practical dielectrics dividing wafer for use in integrated circuit devices, the semiconductor area 15 is bonded and separated into, for example, an area measuring three to several millimeter square, while the semiconductor area 16** is separated into an area measuring one to two millimeters square.

Next, the first method for manufacturing the dielectrics dividing wafer of the present invention is explained by reference to FIGS. 3(*a*)–3(*f*). Since this manufacturing method creates a wafer by bonding two substrates, the dielectric film depositing process shown in FIG. 3(*a*) deposits a silicon oxide film as a dielectric film to a thickness of 1 to 1.5 μm on one of the substrates 21 by applying, for example, the LOCOS process. To do this, a silicon nitride film 22*a* with a thickness of about 0.2 μm is deposited on the surface of of the substrate 21 as is ordinarily done, and the surface of the substrate 21 can then be oxidized under a high temperature using the silicon nitride film as a mask.

FIG. 3(*b*) shows the bonding process. In this process, the surface of one substrate 21 is ground to remove the silicon nitride film 22*a*, and the semiconductor face is exposed to the dielectric films 22 and then mirror finished. The rear side of the other substrate 23 is also mirror finished. Next, with both substrates 21 and 23 adhered together, they are bonded in an inert gas atmosphere, such as nitrogen gas, at a high temperature of, for example, 1200° C. for two hours. Through this process, the dielectric film 22 on the substrate 21 and the semiconductor on the substrate 23 are firmly bonded. Moreover, the semiconductors on both substrates are bonded to each other, resulting in an integrated wafer 20. Furthermore, in this embodiment, the other substrate 23 is ground to the desired thickness, for example about 20 μm, to arrive at the condition shown in the figure. Through this process, which is outlined in FIG. 3(*b*), a wafer 20 in which the dielectric film 22 with a thickness of about 1 μm is embedded is obtained. Although this embodiment requires that dielectric film 22 be attached to one substrate 21 before bonding, the film can, of course, also be attached to the other substrate 23.

FIG. 3(*c*) shows the groove cutting process, in which grooves 24 are trenched so that they reach the dielectric film 22 from the surface 20*a* and the rear side 20*b* of the wafer. This groove cutting can favorably use the reactive-ion etching process by using, for example, SF, and oxygen as reaction gases, while the trench-like groove 24 is cut straight and deeply down to the dielectric film 22, which uses a silicon oxide film or the like as a masking film 24*a*, in width as narrow as 10 μm or less, at which the etching process may be stopped automatically. The grooves 24 on the left end of the figure are cut to separate the adjoining semiconductor areas from the vertical circuit elements, while the grooves cut from the surface 20*a* and from the rear side 20*b* are staggered slightly as shown.

FIG. 3(*d*) illustrates the dielectric film depositing process, in which a wafer 20 is steam-oxidized under a high temperature of about 1100° C. depositing a dielectric film 25 of silicon oxide or the like to a thickness of about 1 μm over the whole face of the wafer on both sides of the grooves 24. FIG. 3(*e*) shows the groove filling process, in which polycrystalline silicon 26 is applied over the whole surface of the wafer under a temperature of 500° to 600° C. via the ordinary heat CVD process which uses monosilane or the like as a material gas, to fill the grooves 24. Since the polycrystalline silicon grows from both inner sides of the groove 24, the groove filling process can be completed within a short time if the groove 24 is made with a width as narrow as 10 μm or less.

FIG. 3(*f*) illustrates the completed wafer 20. To bring the condition in FIG. 3(*e*) to its completion state, it is necessary to remove the polycrystalline silicon film 26 from both sides of the wafer 20, but not the inside of the grooves 24, which can be removed most simply by using the so-called etch back in the CVD equipment, followed by removing the silicon oxide film beneath the former film by etching with dilute hydrogen fluoride, or by mirror grinding the wafer surface. The completed wafer 20 is dielectrically separated by the dielectric films 22 and 25 into a semiconductor area 27 for vertical circuit elements, formed continuously from the surface 20*a* to the rear side 20*b*, and the semiconductor area 28 for planar-type circuit elements, exposed only on the surface 20*a*.

Next, the second method for manufacturing the dielectrics dividing wafer according to the present invention will be explained by referring to FIGS. 4(*a*)–4(*f*). This second manufacturing method uses a monocrystalline silicon wafer 30, and the recess-cutting process illustrated in FIG. 4(*a*) trenches recesses 31 deeply from the rear side 30*b* via a chemical etching process using a photo-resist film 31*a* as a mask. These recesses 31 may be trenched with a little side etching and in a side form nearly perpendicular to the wafer face by alkaline etching with KOH applying a 111 face silicon substrate to the wafer 30, or the recesses may be trenched by applying a dry-etching process or reactive-ion etching process. The surface 30*a* of the wafer 30 may be ground to the desired thickness after the recesses 31 have been trenched.

In the dielectric film covering process shown in FIG. 4(*b*), the whole surface of the wafer 30 including the inside of the recesses 31 is covered with a dielectric film 32 to a thickness of about 1 μm by, for example, the steam oxidizing process. FIG. 4(*c*), which follows, illustrates the recess filling process, in which polycrystalline silicon 33 is applied over the rear side 30*b* of the wafer 30 using a heat CVD process to fill the recesses 31 as shown. Subsequently, the rear side 30*b* is ground to remove any excess polycrystalline silicon 33 from the surface, but not from inside the recesses 31.

The next FIG. 4(*d*) illustrates the groove-cutting process, in which grooves 34 are trenched from the surface 30*a* of the wafer 30 until they reach the dielectric films 32 at the bottom of the recesses 31 using the reactive-ion etching process previously described, which uses silicon oxide film or the like as a masking film 34*a*.

FIG. 4(*e*) illustrates the dielectric film-depositing and groove-filling processes, in which a dielectric film 35 is deposited to a thickness of about 1 μm over the whole surface including the sides of the grooves 34 via the steam-oxidizing process or the like. Then polycrystalline silicon 35 is applied to the surface 30*a*, and used to fill the grooves 34. Subsequently, any excess polycrystalline silicon 35 and the dielectric film 34 are removed from the surface 30*a* of the wafer 30 in the manner previously described, as is the dielectric film 34 from the rear side 30*b*, to obtain a completed wafer 30 as shown in FIG. 4(*f*).

In the wafer 30 manufactured by the second manufacturing method, dielectric separation is achieved on the semiconductor area 37 for vertical circuit elements by the application of dielectric film 32 to cover the recesses in the same manner as in the case of FIG. 3, and the semiconductor area 35 for planar-type circuit elements. This second manufacturing method requires control of the trench depth of the recesses 31 during the manufacturing process in FIG. 4(*a*), and a high accuracy in the grinding of the wafer 30 from the surface 30*a*. However, since the dielectric film 32 covering the sides of the recesses 31 can be utilized as partitions for the dielectrics separation of each semiconductor area, the method can simplify the trenching of the grooves 34 in FIG. 4(*d*) and application of the polycrystalline silicon 36 in FIG. 4(*e*) only from the surface 30*a*, and can greatly facilitate the processing of the grooves 34, which can be shallower than in the first manufacturing method.

As described above, in the dielectrics dividing wafer according to the present invention, the dielectric films are embedded in the wafer interior in a predetermined pattern extending laterally parallel to the wafer face; the partition dielectric films are disposed in the form of a vertical wall among the surface and rear side of the wafer and the embedded dielectric films; and semiconductor areas formed continually from the wafer surface to the rear side thereof and surrounded by these partition dielectric films are demarcated. In order to build in these embedded dielectric films into the wafer, two substrates are bonded together via a face disposed with a dielectric film when this film is deposited on either one of the substrates in a predetermined pattern to make the wafer via the first manufacturing method; and recesses are trenched from the rear side of the wafer in a predetermined pattern. Then the face is covered with the dielectric film and the recesses are filled with polycrystalline silicon via the second manufacturing method. As a result, the following results are obtained:

(*a*) by disposing the partition dielectric films in the form of a vertical wall among the embedded dielectric film, the surface, and the rear side of the wafer using the dielectric films embedded in a pattern extending laterally inside the wafer as a relay part, the semiconductor areas suitable for building in vertical circuit elements can be easily demarcated as an area formed continually from the wafer surface to its rear side;

(*b*) since the semiconductor area for the-vertical circuit elements is demarcated as an area completely surrounded by the partition dielectric films disposed on the surface and the rear side of the wafer, vertical circuit elements with a large capacity can be assembled into an integrated circuit device without creating a possibility for mutual operation interference;

(*c*) since the partition dielectric films dielectrically separating the semiconductor areas from each other can be constructed via the dielectric films deposited on the sides of the grooves with a narrow trench width or on the face of the recesses, the labor and cost required to manufacture the dielectrics dividing wafer is less than the labor and cost required for conventional wafers, and the space required for dielectrically separating the semiconductor areas from each other is reduced, thus making it possible to integrate circuit devices even more; and (*d*) since planar-type circuit elements can be easily built in with vertical circuit elements by disposing the partition dielectric films on the surface of the wafer using embedded dielectric films to surround the predetermined range of the pattern of the wafer, the wafer is beneficial for integrated circuits that combine small and large capacity circuit elements.

The invention has been described with reference to certain preferred embodiment thereof. It will be understood, however, that modifications and variations are possible within the scope of the appended claims.

What is claimed is:

1. A method to manufacture a dielectrics dividing wafer, comprising the steps of: forming dielectric films in a pattern on at least one face of two semiconductor substrates; bonding the substrates together at the faces to form a single wafer having a front face surface and a rear face surface and having the dielectric films located internally to the single wafer; cutting grooves in the form of a vertical wall from the front face surface and the rear face surface of the single wafer so that the grooves reach the dielectric films; attaching partition dielectric films to the sides of the grooves; and filling the grooves with polycrystalline silicon; wherein semiconductor regions, surrounded by the partition dielectric films, are formed continuously from the front face surface of the single wafer to the rear face surface of the single wafer.

* * * * *